(12) United States Patent
Huang et al.

(10) Patent No.: US 11,094,608 B2
(45) Date of Patent: Aug. 17, 2021

(54) HEAT DISSIPATION STRUCTURE INCLUDING STACKED CHIPS SURROUNDED BY THERMAL INTERFACE MATERIAL RINGS

(71) Applicant: TAIWAN SEMICONDUCTOR MANUFACTURING CO., LTD., Hsinchu (TW)

(72) Inventors: Po-Hsiang Huang, Tainan (TW); Chin-Chou Liu, Jhubei (TW); Chin-Her Chien, Chung-Li (TW); Fong-yuan Chang, Hsinchu (TW); Hui Yu Lee, Hsin-Chu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 34 days.

(21) Appl. No.: 16/433,967

(22) Filed: Jun. 6, 2019

(65) Prior Publication Data
US 2020/0006194 A1  Jan. 2, 2020

Related U.S. Application Data

(60) Provisional application No. 62/692,504, filed on Jun. 29, 2018.

(51) Int. Cl.
*H01L 23/42* (2006.01)
*H01L 25/065* (2006.01)
(Continued)

(52) U.S. Cl.
CPC .......... *H01L 23/42* (2013.01); *H01L 23/3128* (2013.01); *H01L 23/3672* (2013.01);
(Continued)

(58) Field of Classification Search
CPC . H01L 23/42; H01L 23/3128; H01L 23/3672; H01L 25/0657; H01L 25/50
See application file for complete search history.

(56) References Cited

U.S. PATENT DOCUMENTS

| 2014/0217575 A1* | 8/2014 | Hung | H01L 23/36 257/713 |
| 2015/0035134 A1* | 2/2015 | Hung | H01L 24/32 257/712 |

(Continued)

OTHER PUBLICATIONS

"Stack, n." OED Online. Oxford University Press, Sep. 2020. Web. Oct. 31, 2020. (Year: 2020).*

*Primary Examiner* — Matthew E. Gordon
(74) *Attorney, Agent, or Firm* — Sterne, Kessler, Goldstein & Fox P.L.L.C.

(57) ABSTRACT

The present disclosure describes heat dissipating structures that can be formed either in functional or non-functional areas of three-dimensional system on integrated chip structures. In some embodiments, the heat dissipating structures maintain an average operating temperature of memory dies or chips below about 90° C. For example, a structure includes a stack with chip layers, where each chip layer includes one or more chips and an edge portion. The structure further includes a thermal interface material disposed on the edge portion of each chip layer, a thermal interface material layer disposed over a top chip layer of the stack, and a heat sink over the thermal interface material layer.

20 Claims, 10 Drawing Sheets

(51) Int. Cl.
    *H01L 25/00* (2006.01)
    *H01L 23/31* (2006.01)
    *H01L 23/367* (2006.01)

(52) U.S. Cl.
    CPC .......... *H01L 25/0657* (2013.01); *H01L 25/50* (2013.01); *H01L 2225/06541* (2013.01)

(56) References Cited

U.S. PATENT DOCUMENTS

| | | | |
|---|---|---|---|
| 2015/0035135 A1* | 2/2015 | Hung | H01L 23/36 257/712 |
| 2015/0194364 A1* | 7/2015 | Lamorey | H01L 23/36 257/698 |

* cited by examiner ered accord-
HEAT DISSIPATION STRUCTURE INCLUDING STACKED CHIPS SURROUNDED BY THERMAL INTERFACE MATERIAL RINGS

CROSS-REFERENCE TO RELATED APPLICATION

This application claims the benefit of U.S. Provisional Patent Application No. 62/692,504, titled "Heat Dissipation Structures," which was filed on Jun. 29, 2018 and is incorporated herein by reference in its entirety.

BACKGROUND

Three-dimensional system on integrated chip structures with increased chip density can exhibit high heat density and poor thermal dissipation performance compared to their two-dimensional counterparts. Increased heat density in three-dimensional system on integrated chip structures can lead to electromigration and reliability issues.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
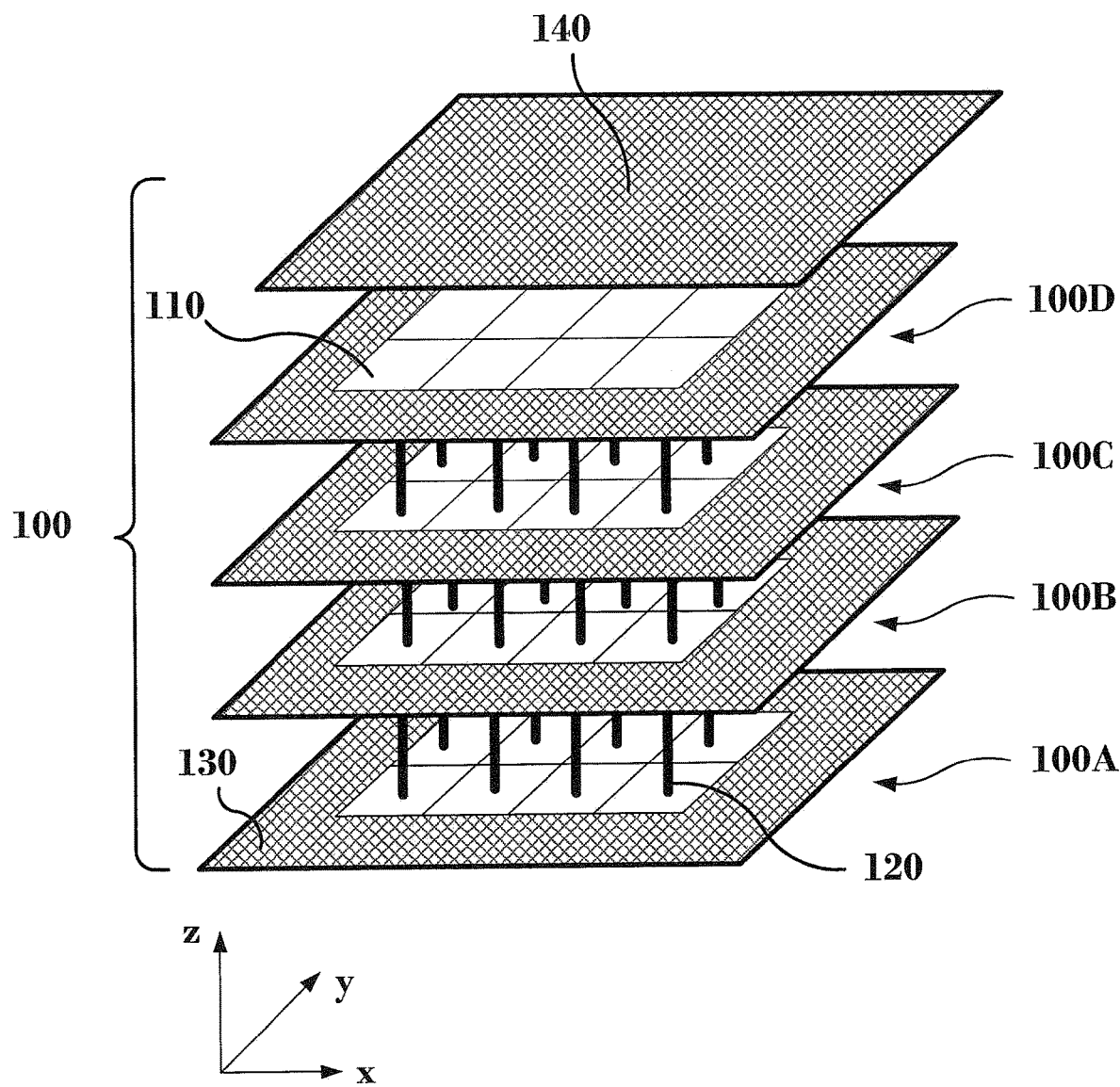
FIG. 1 is a partial isometric view of a three-dimensional system on integrated chip structure with a thermal interface rings, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

A three-dimensional (3D) system on integrated chip ("3D SoIC") structure is a non-monolithic vertical structure that includes two to eight two-dimensional (2D) flip chips stacked on top of each other. The 2D flip chips can be a compilation of chips with different functionality, such as logic chips, memory chips, radio frequency (RF) chips, and the like. By way of example and not limitation, the logic chips can include central process units (CPUs) and the memory chips can include static access memory (SRAM) arrays, dynamic random access memory (DRAM) arrays, magnetic random access memory (MRAM) arrays, or other memory arrays. In the 3D SoIC structure, each of the 2D chips can be interconnected via microbumps, bonding pads, by through silicon vias (TSV), or by other interconnect structures, which can be shorter than the interconnects used in a 2D SoIC structure. Thus, 3D SoIC structures can be faster, denser, and have additional functionality than their 2D counterparts. Further, the 3D SoIC structures can have a smaller footprint compared to 2D SoIC structures.

On the other hand, since 3D SoIC structures have increased chip density and a reduced footprint (which can translate to a limited heat sink area), they also have higher heat density per unit area and can be more susceptible to thermal dissipation issues compared to 2D SoIC structures. The increased heat density in 3D SoIC structures can lead to electromigration and reliability issues. For example, electromigration can increase the resistance of interconnects and TSVs, deteriorate the performance of the chips, and reduce the lifetime of the 3D SoIC structures. Reliability issues can arise due to the materials included in the 3D SoIC structures, which include materials with different coefficients of thermal expansion (CTE). Materials with different CTE can result in thermo-mechanical stress between integrated circuit (IC) chips. Additionally, different types of IC chips can have different thermal tolerances. For example, memory chips (e.g., SRAM arrays) can have lower thermal tolerances (e.g., equal to or below about 90° C.) compared to logic chips, which can have higher thermal tolerances (e.g., equal to or above about 120° C.). For the aforementioned reasons, heat dissipation in 3D SoIC structures should be addressed.

To address the above shortcomings, embodiments described herein are directed to heat dissipating structures that can be formed in functional or non-functional areas of the 3D SoIC structures. In some embodiments, the heat dissipating structures can include thermal interface material (TIM) rings, vertical conductive structures disposed in the dummy regions (e.g., non-functional regions) or the molding regions of the 3D SoIC structure, vertical conductive structures disposed within the active chip area and around high heat output areas (hot spots), or combinations thereof. In some embodiments, existing vertical structures in a 3D SoIC structure can be re-purposed to function as additional heat dissipation paths. The embodiments described herein can be applied to a range of 3D SoIC structures including, but not limited to, 3D SoIC structures with dummy regions and molding regions.

According to some embodiments, FIG. 1 is a partial isometric view of a 3D SoIC structure 100. 3D SoIC structure 100 includes four chip layers (e.g., 100A, 100B, 100C, and 100D); however, the number of chip layers is not limiting and fewer or additional chip layers are possible (e.g., 2, 6, or 8). For illustration purposes, FIG. 1 includes select portions of a 3D SoIC structure and other portions (not shown) may be included. For example, microbumps, molding regions/dummy regions, adhesion layers, a heat sink, interconnects, ball grid array (BGA) connectors, silicon interposers, and other components or structural elements may be included. Each chip layer can include one or more chips 110, which are electrically connected to chips in adjacent chip layers through vertical electrical conductive structures 120. In some embodiments, vertical electrical conductive structures 120 can include TSVs or other types of vertical conductive structures. By way of example and not limitation, bottom chip layer 100A can include one or more microprocessors or CPUs, while chip layers 100B through 100D can include one or more memory chips (e.g., SRAM chips, DRAM chips, MRAM chips, other types of memory chips, or combinations thereof). In some embodiments, bottom chip layer 100A generates more heat than layers 100B, 100C, and 100D. By way of example and not limitation, the temperature of bottom chip layer 100A under operation can be higher than about 100° C. (e.g., about 105° C., about 110° C., about 115° C., or about 130° C.).

In terms of heat dissipation, 3D SoIC structure 100 includes a TIM ring 130 on the periphery of each chip layer and a top blanket TIM layer 140 over the entire top chip layer 100D. By way of example and not limitation, TIM rings 130 and TIM layer 140 can include materials, such as silver, aluminum nitride, silicon carbide, or combinations thereof. In further embodiments, TIM rings 130 and TIM layer 140 can include a thermal grease with a thermal conductivity between about 1.5 and about 15 W/(m·K). By way of example and not limitation, TIM layer 140 can have a thickness that can range from about 0.1 mm to about 0.5 mm, and TIM rings 130 can have a thickness that can range from about 0.3 mm to about 0.8 mm. In some embodiments, each TIM ring 130 forms a continuous layer around the one or more chips 110 of each chip layer in a non-functional region of the chip layer. For example, the periphery of chip layers 100A-100D may not include active/functional components. Instead, the periphery of chip layers 100A-100D may be occupied by layers that provide structural support to 3D SoIC structure 100. According to some embodiments, the periphery of chip layers 100A-100D can be used to host TIM rings 130. A heat sink, not shown in FIG. 1, can be disposed over the top blanket TIM layer 140. According to some embodiments, TIM rings 130 and blanket TIM layer 140 form a heat dissipation path that transfers heat generated by bottom chip layer 100A to the heat sink above blanket TIM layer 140. As shown in FIG. 1 and discussed above, TIM rings 130 are located along the periphery of each chip layer and form a continuous layer, which includes non-functional areas of the 3D SoIC structure.

Figure 2A:
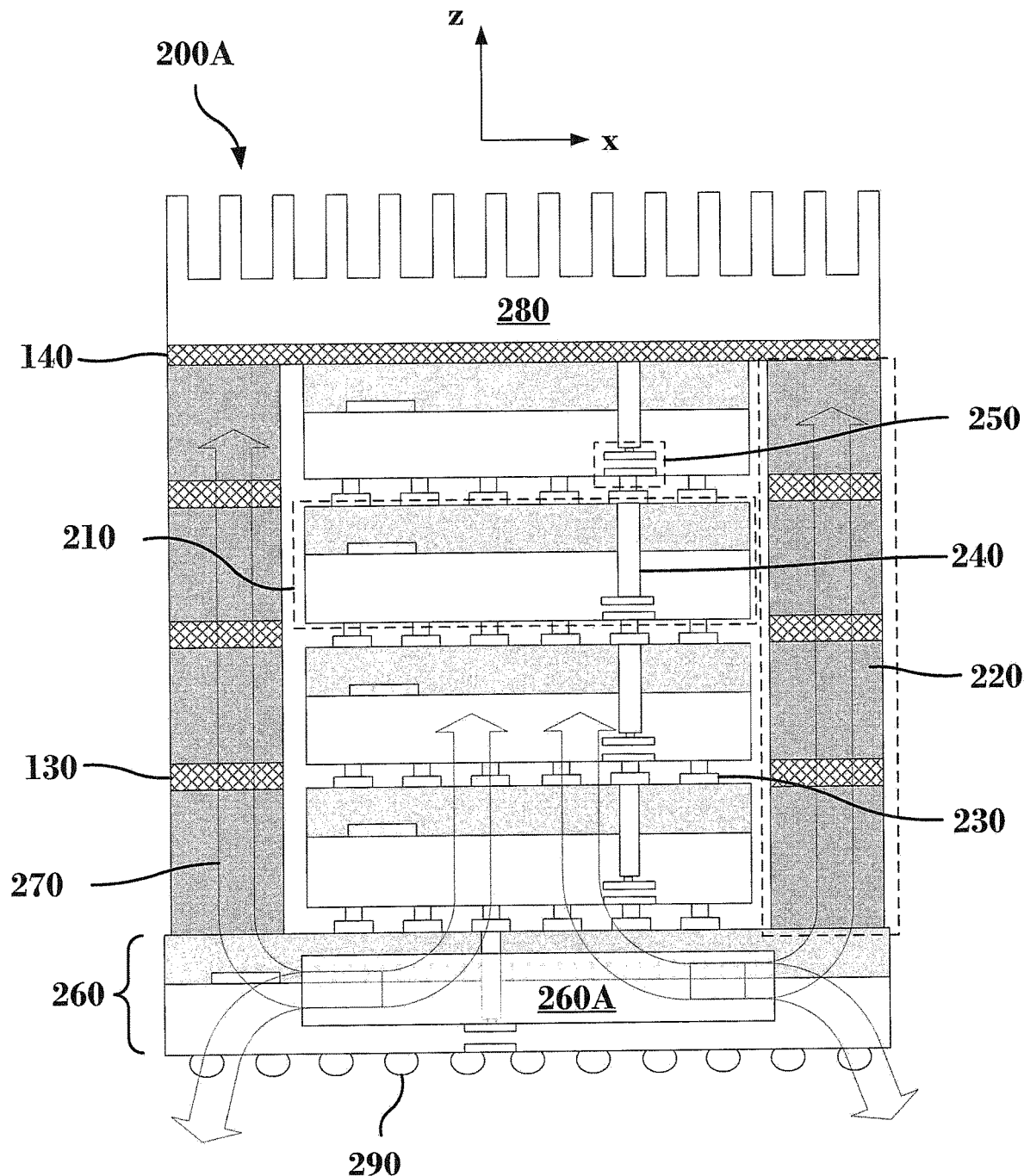
FIG. 2A is a cross-sectional view of a three-dimensional system on integrated chip structure with thermal interface rings in a dummy region, according to some embodiments.

FIG. 2A is a cross-sectional view of 3D SoIC structure 200A. According to some embodiments, 3D SoIC structure 200A is similar to 3D SoIC structure 100. However, 3D SoIC structure 200A is more detailed and therefore includes additional electrical components or structural elements. For example, 3D SoIC structure 200A includes a stack of memory chips 210, dummy regions 220 that surround the stack of memory chips 210, vertical conductive structures 230 and 240, bonding pad structures 250, a bottom layer 260 with a logic chip 260A below the stack of memory chips 210 and dummy regions 220, and a heat sink 280 over top TIM layer 140. Dummy regions 220 are electrically non-functional structures with poor thermal conductivity (e.g., below about 1.3 W/(m K)). By way of example and not limitation, dummy regions 220 (e.g., non-functional regions) can provide structural support to 3D SoIC structure 200A and include a combination of electrically insulating materials and metal or metallic conductive structures. By way of example and not limitation, dummy regions 220 can include a molding compound (e.g., an epoxy-based material) that electrically isolates individual components of the memory chip and provides structural support to 3D SoIC structure 200A. In an alternative example, dummy regions 220 can include oxide-based dielectric materials (e.g., silicon oxide) and metal or metallic conductive structures. The chips in 3D SoIC structure 200A can be electrically coupled to neighboring top and bottom chips through conductive structures 230 (e.g., pads), vertical conductive structures 240 (e.g., TSVs), and bonding pad structures 250. The aforementioned structures are merely an example, and alternative or additional structures, or methods can be used to electrically couple the chips in 3D SoIC structure 200A. In some embodiments, conductive structures 230, vertical conductive structures 240 and bonding pads structures 250 can be used for signal propagation and/or power distribution between memory chips 210 and logic chip 260A. In some embodiments, logic chip 260A can include one or more CPU chips that can generate more heat than memory chips 210.

Figure 3:
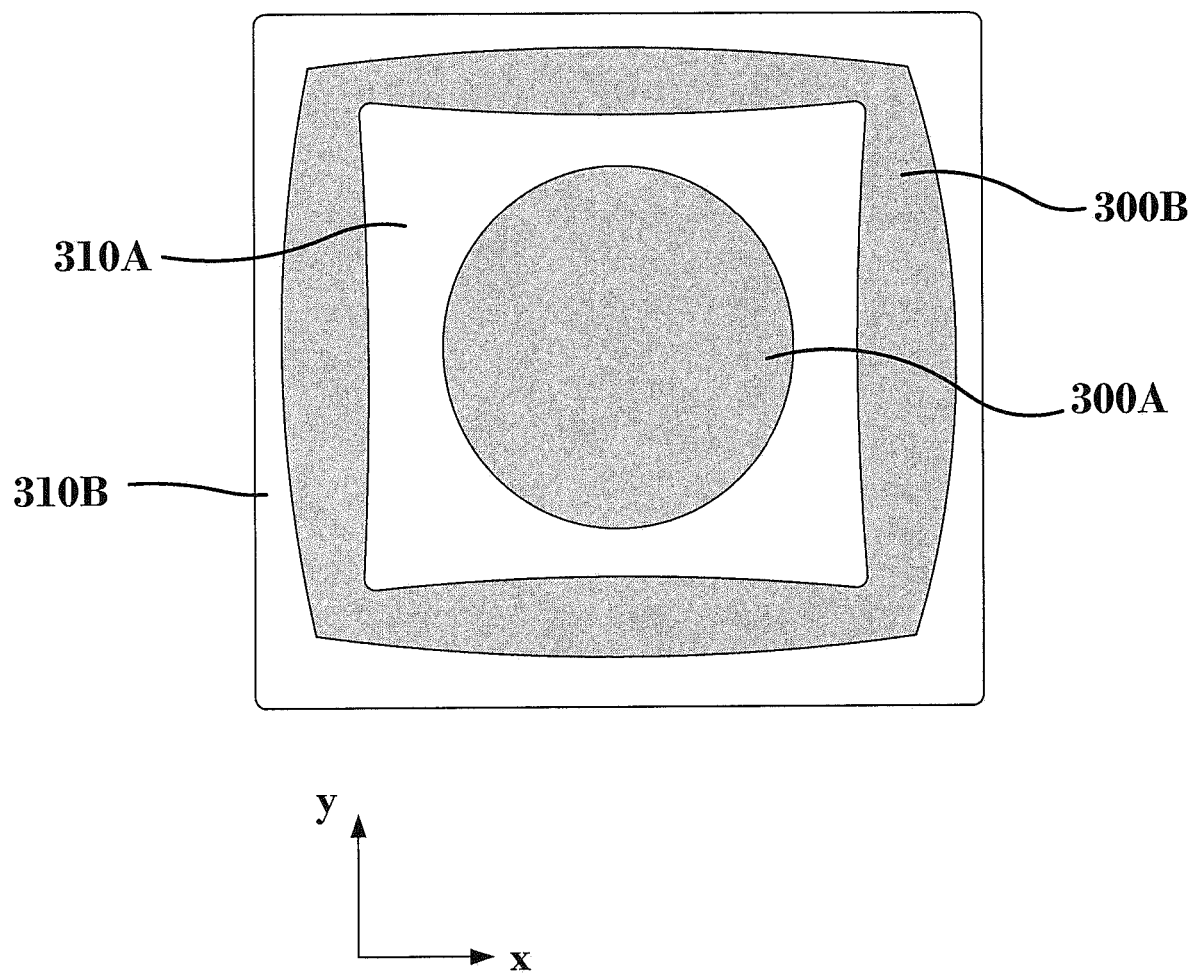
FIG. 3 is a heat map of a three-dimensional system on integrated chip structure with thermal interface rings in a dummy region, according to some embodiments.

In some embodiments, an objective of 3D SoIC structure 200A is to form heat dissipation paths that channel a portion of the heat generated by logic chip 260A, through dummy region 220, to heat sink 280, so that the average operation temperature of memory chips 210 can be below about 90° C. To facilitate the formation of the heat dissipation path, TIM rings 130 are disposed in dummy regions 220 and interposed between adjacent memory chips 210. Additionally, top blanket TIM layer 140 is interposed between the surface of the top memory chip 210 and the backside surface of heat sink 280. In some embodiments, the placement of TIM rings 130 can improve the heat conductivity of dummy regions 220 and reduce the average operating temperature of memory chips 210 by channeling a majority of the heat generated in logic chip 260A through dummy regions 220. By way of example and not limitation, TIM rings 130 can reduce the average operating temperature of memory chips 210 from about 100° C. to about 90° C., which is a reduction of about 10%. Heat maps can reveal the heat distribution achieved by TIM rings 130. For example, FIG. 3 is a heat map that corresponds to 3D SoIC structure 200A when looking 3D SoIC structure 200A from the top (e.g., looking down from heat sink 280 of FIG. 2A). In FIG. 3, heat zones 300A and 300B correspond respectively to areas above memory chips 210 and dummy regions 220. Accordingly, heat zone 310A corresponds to an area between memory chips 210 and dummy regions 220, and heat zone 310B corresponds to the edges of 3D SoIC structure 200A outside the perimeter of logic chip 260A. In some embodiments, the temperature of heat zones 300A and 300B is about 90° C., while the temperature of heat zones 310A and 310B is below about 90° C. (e.g., about 85° C., about 80° C., or about 70° C.). By way of example and not limitation, arrows 270 in FIG. 2A illustrate the heat dissipation paths in 3D SoIC structure 200A. As shown in FIG. 2A, a portion of the heat generated in logic chip 260A is channeled through TIM rings 230 in dummy regions 220, so that the heat dissipated directly through memory chips 210 can be reduced. Accordingly, heat can escape through ball grid array (BGA) connectors 290 to a printed circuit board (PCB) or another substrate not shown in FIG. 2A.

Figure 4:
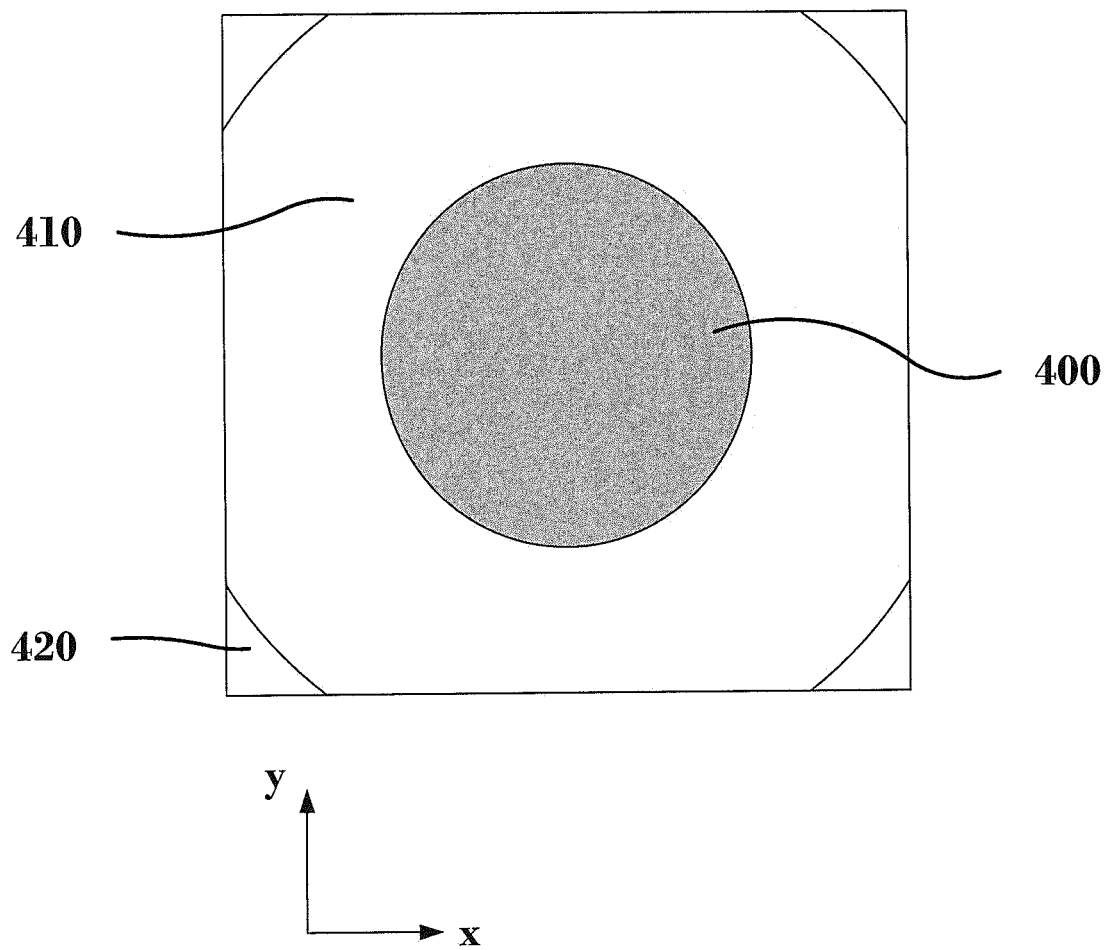
FIG. 4 is a heat map of a three-dimensional system on integrated chip structure without thermal interface rings in a dummy region, according to some embodiments.

In contrast, FIG. 4 is another heat map that corresponds to a 3D SoIC structure that does not include TIM rings 230 in dummy regions 220. As a result, the heat distribution for this 3D SoIC structure is different from the heat distribution of 3D SoIC structure 200A shown in FIG. 3. For example, heat zone 400 corresponds to an area above memory chips 210, heat zone 410 corresponds to an area between memory chips 210 and over dummy regions 220, and heat zone 420 corresponds to the corners of the 3D SoIC structure. In this example, the temperature that corresponds to heat zone 400 (e.g., above memory chips 210) is about 100° C., while the temperatures that correspond to heat zones 410 and 420 respectively are below about 100° C. This means that the average operating temperature of the memory chips can be higher in the absence of TIM rings 130, and dummy regions 220 share less of a heat load with memory chips 210.

Figure 2B:
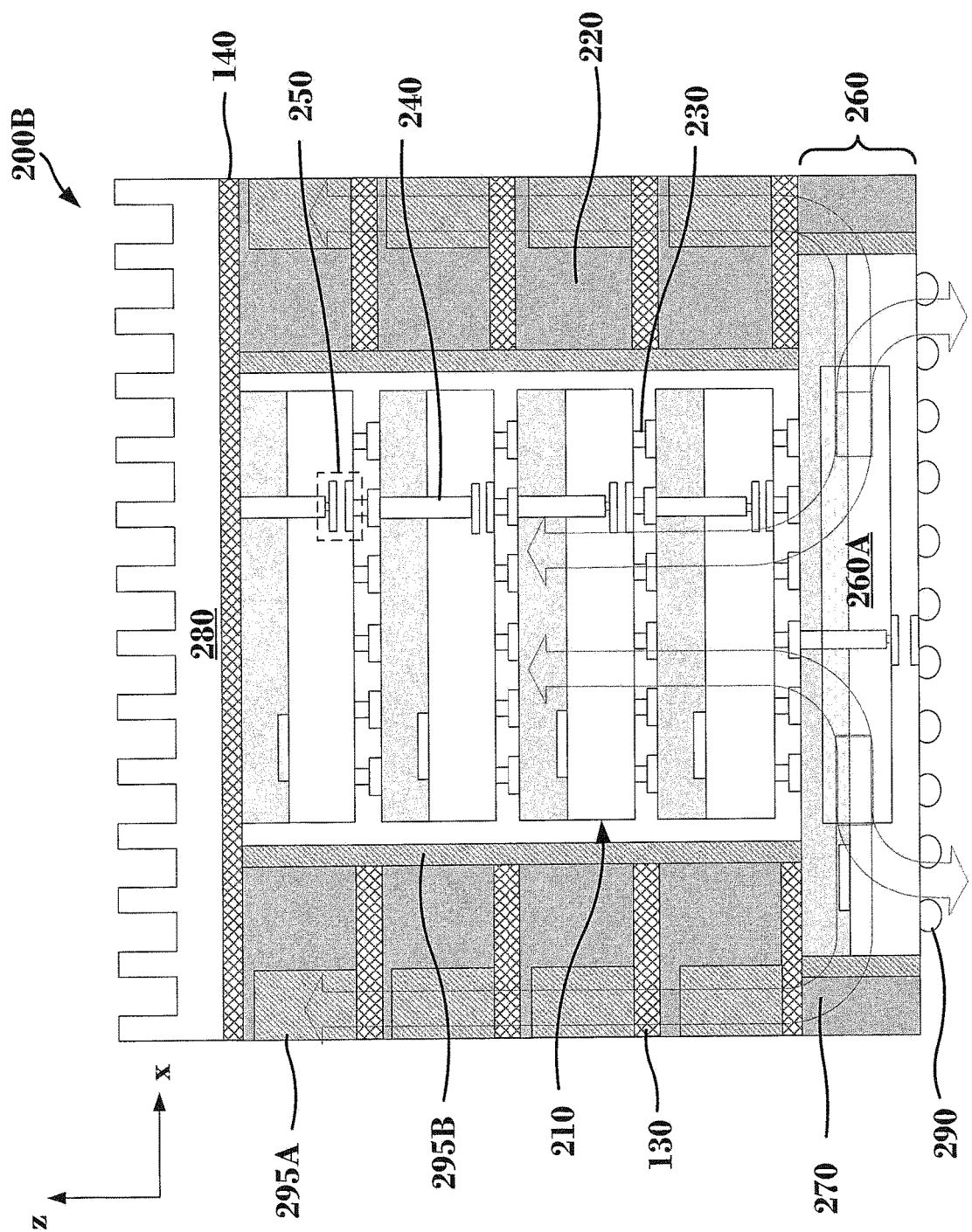
FIG. 2B is a cross-sectional view of a three-dimensional system on integrated chip structure with thermal interface rings and thermally conductive vertical structures in a dummy region, according to some embodiments.

According to some embodiments, FIG. 2B is a cross-sectional view of a 3D SoIC structure 200B, which can be a variant of 3D SoIC structure 200A shown in FIG. 2A. By way of example and not limitation, 3D SoIC structure 200B can have dummy regions 220 that may extend below the stack of memory chips 210 and surround bottom layer 260. Further, 3D SoIC structure 200B can include complementary thermally conductive structures 295A and 295B in dummy regions 220. According to some embodiments, thermally conductive structures 295, in addition to TIM rings 130, can further increase the heat dissipation rate of 3D SoIC structure 200B. By way of example and not limitation, thermally conductive structures 295A can form a network of structures that extends laterally in dummy regions 220, whereas thermally conductive structures 295B can extend vertically through dummy regions 220. In some embodiments, thermally conductive structures 295A and 295B can include copper, aluminum, metal alloys, or materials with a thermal conductivity greater than about 200 W/(m·K). Thermally conductive structures 295A and 295B can be in physical contact with TIM rings 130 and can be configured to enhance the heat dissipation through dummy regions 220. Further, the layout of thermally conductive structures 295A and 295B is not limited to the illustration of FIG. 2B. Thus, additional layouts are within the spirit and the scope of this disclosure. Arrows 270 in FIG. 2B represent the heat dissipation paths between logic chip 260A and heat sink 280 in 3D SoIC structure 200B.

In addition to the above, thermally conductive vertical structures can be used within each chip layer to provide additional heat dissipation paths in the 3D SoIC structure. By way of example and not limitation, the thermally conductive vertical structures can include TSVs that can be formed in predetermined locations across each chip layer to improve the heat dissipation between layers in the vertical direction (e.g., z-direction). According to some embodiments, these vertical structures are collectively referred to as "thermal vertical structures" or "thermal TSVs."

Figure 5:
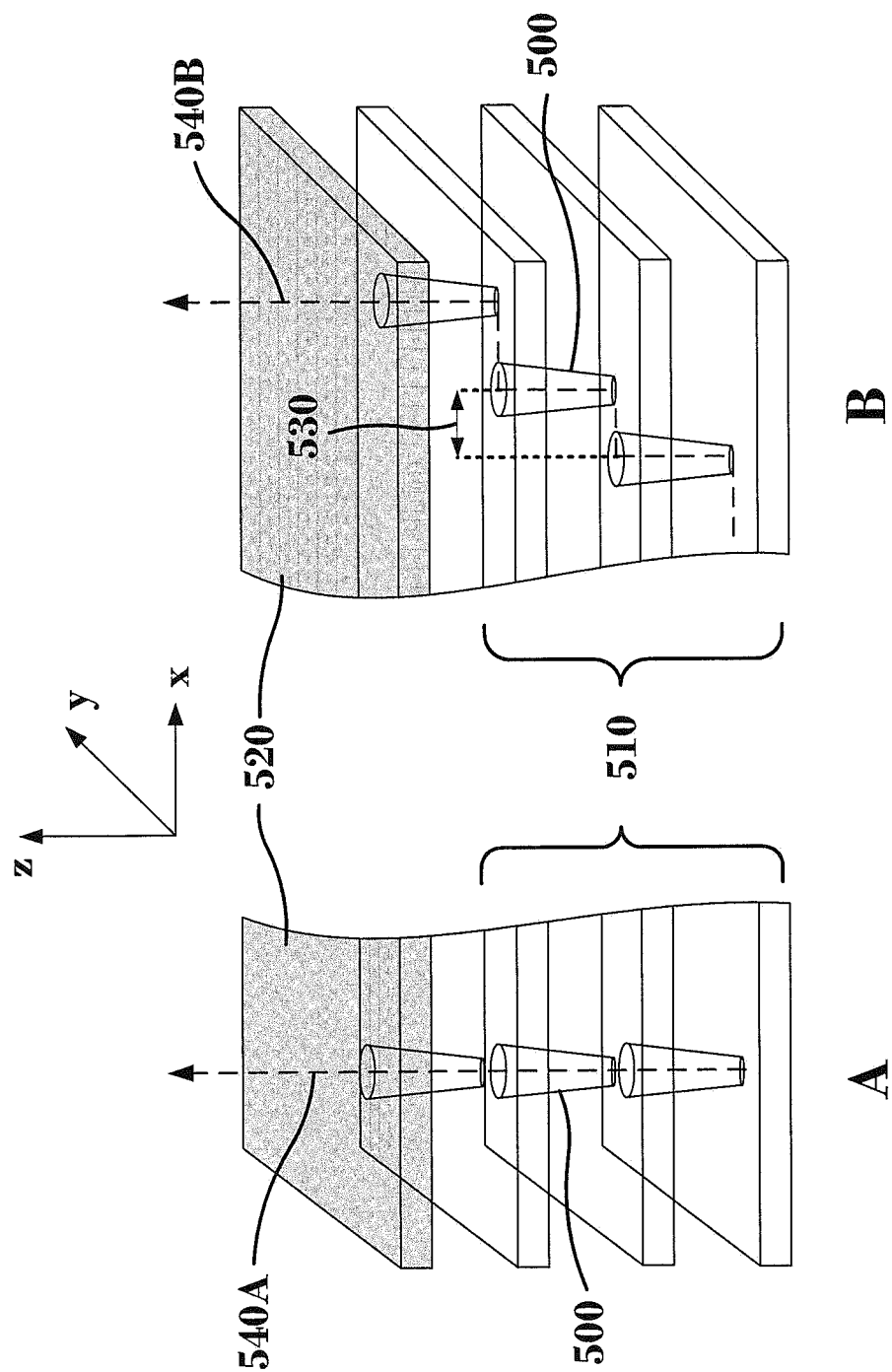
FIG. 5 is an isometric partial view of a three-dimensional system on integrated chip structure with thermal vertical structures arranged in two exemplary layouts, according to some embodiments.

According to some embodiments, FIG. 5 is an isometric partial view of a 3D SoIC structure with thermal vertical structures 500 according to two exemplary layouts A and B. In the example of layout A, thermal vertical structures 500 can be aligned vertically (e.g., can be stacked) between chip layers 510 and heat sink layer 520. Consequently, heat path 540A of layout A can be limited to the vertical direction (e.g., z-direction). In layout B, thermal vertical structures 500 can be formed in each chip layer 510 with a lateral offset 530 so that heat path 540B can be both vertical (e.g., in the z-direction) and lateral (e.g., in the x and y-direction). By way of example and not limitation, lateral offset 530 can be configured to have a different direction from one chip layer to another. As a result, the length and the direction of each heat dissipation path 540A and 540B for each layout (e.g., layout A and layout B, respectively) can vary. For this reason, each layout can be used for a different purpose. For example, layout A can be used to create a vertical heat dissipation path, whereas layout B can be used to provide a combination of a lateral and vertical heat dissipation path from one layer to the next. Thus, a 3D SoIC structure may include layout A, layout B, or combinations thereof to improve the heat transfer between one location of the chip to another.

In the example of 3D SoIC structures 200A and 200B of FIGS. 2A and 2B, respectively, thermally conductive vertical structures can be disposed in bottom chip layer 260 and arranged according to layouts A and B to form vertical and lateral/vertical heat dissipation paths between logic chip 260A and heat sink 280. Additionally, both layouts A and B can be used to provide "targeted" heat dissipation to localized heat sources or "hot spots" within a chip layer. For example, thermal vertical structures 500 can be arranged according to layout A, layout B, or combinations thereof over a localized hot spot to improve the heat transfer rate in the vicinity of the hot spot. In some embodiments, local hot spots can appear on any chip layer and are not limited to chip layers with logic chips. Consequently, thermal vertical structures can be formed at any chip level 510 on "as-needed" basis to transfer the heat away from local hot-spots.

In some embodiments, in referring to FIG. 5, the pitch between thermal vertical structures 500 within the same chip layer 510 can range from about 1 μm to about 100 μm (e.g., from 1 μm to 20 μm, from 5 μm to 25 μm, from 15 μm to 30 μm, from 25 μm to 60 μm, from 50 μm to 80 μm, from 70 μm to 100 μm, etc.), depending on the design and heat dissipation requirements of the 3D SoIC structure. Further, the diameter of thermal vertical structures 500 can range from about 0.5 μm to about 2 μm. According to some embodiments, the heat dissipation rate increases as the pitch of thermal vertical structures 500 within a chip layer 510 decreases. In other words, the heat dissipation rate is inversely proportional to the pitch between thermal vertical structures within the chip layer. Further, the heat dissipation rate increases when the ratio—defined by the total area occupied by the thermal vertical structures to the total area occupied by the chips—increases. However, the number of thermal vertical structures cannot increase indefinitely because the chip density within a chip layer may suffer. Therefore, it is desirable to balance the density of the thermal vertical structures and chip density for optimal heat dissipation performance within a 3D SoIC structure.

Figure 6:
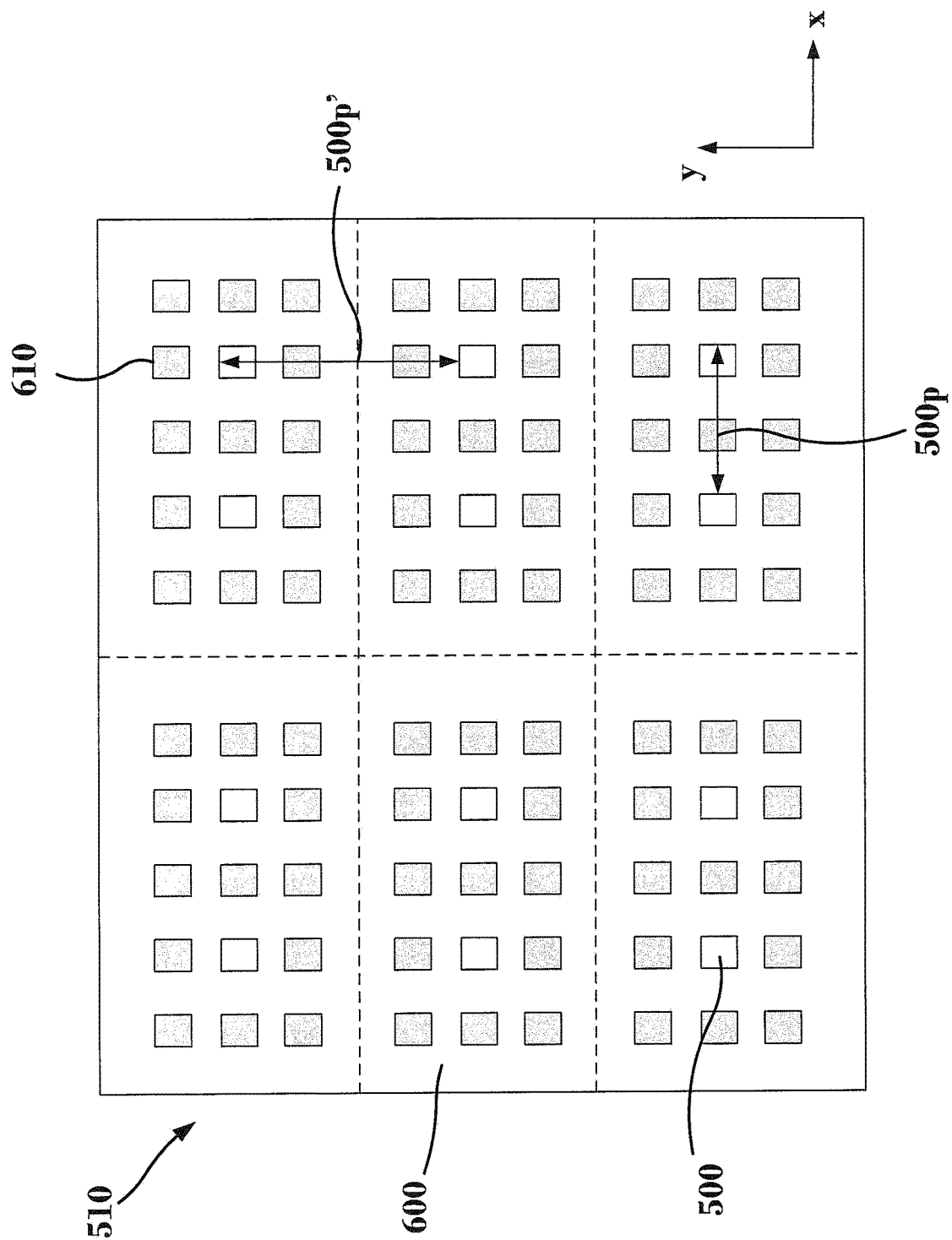
FIG. 6 is a top view of a chip layer with thermally conductive structures arranged between electrically conductive structures, according to some embodiments.

FIG. 6 is a top view of one exemplary chip layer 510 from FIG. 5, where an exemplary distribution of thermal vertical structures 500 is shown among other TSVs 610 within chip areas 600. In some embodiments, TSVs 610 can be electrical connections to CPU chips or to memory chips, such as SRAM, DRAM, MRAM, and/or other memory chips. In some embodiments, pitch 500$p$ (e.g., within chip area 600) and pitch 500$p'$ (e.g., between adjacent chip areas 600) can be adjusted depending on desired heat dissipation characteristics of the 3D SoIC structure and/or the presence of hot spots in chip areas 600, as discussed above. The distribution of thermal vertical structures 500 shown in FIG. 6 is not limiting and layouts with fewer or additional vertical structures 500 are within the spirit and the scope of this disclosure.

According to some embodiments, modifying existing structural elements that are present in a 3D SoIC structure can improve thermal dissipation for the 3D SoIC structure. By way of example and not limitation, a "dummy" vertical structure, which is a non-functional structural element used to improve the process window for certain operations (e.g., etching, chemical mechanical polishing, patterning), can be modified to also serve as a heat dissipation element. More specifically, incorporating metal particles into a liner material of the dummy vertical structure can "transform" a structural element, such as a dummy vertical structure, to a heat dissipation element.

Figure 7:
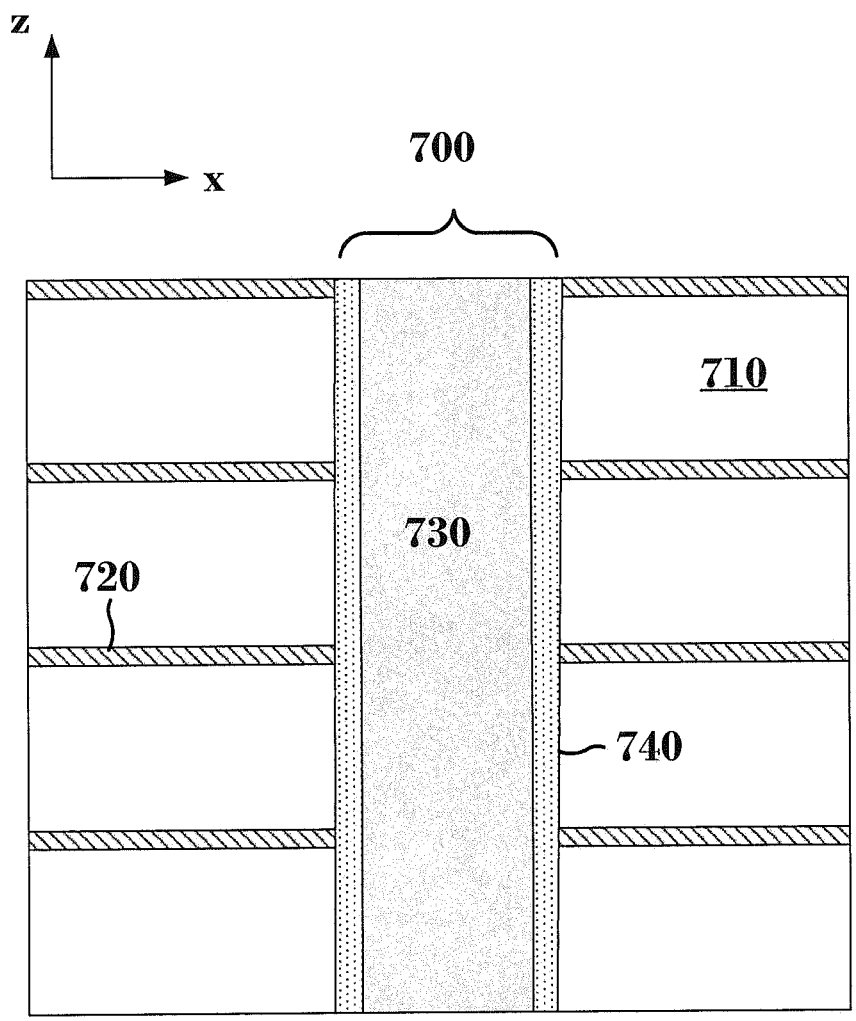
FIG. 7 is a cross sectional view of a dummy thermally conductive structure with a liner containing metal particles, according to some embodiments.

According to some embodiments, FIG. 7 is a cross-sectional view of a dummy vertical structure 700 that is disposed between chip layers 710. In the example of FIG. 7, chip layers 710 are separated by interlayers 720. In some embodiments, interlayers 720 include a dielectric material, such as silicon oxide or hafnium oxide. By way of example and not limitation, dummy vertical structure 700 can include a metal core 730 and a liner material 740, which surrounds metal core 730. By way of example and not limitation, liner material 740 can include silicon oxide, organosilicate glass, etc. By way of example and not limitation, metal core 730 can include a material with a thermal conductivity greater than about 200 W/(m K) (e.g., copper, aluminum, etc.). In some embodiments, liner material 740, which can be a dielectric layer (e.g., silicon oxide) that functions as an adhesive layer for metal core 730, is infused with metal or metallic particles that can improve the thermal conductivity of dummy vertical structure 700. By way of example and not limitation, the metal or metallic particles can include tungsten, tungsten silicide, titanium nitride, titanium, copper, or combinations thereof. According to some embodiment, the metal particles can be incorporated in liner material 740 during the formation of liner material 740 and can have a diameter of about 50 μm. The thickness of liner material 740 can range from about 100 nm to about 800 nm.

In some embodiments, the dummy vertical structures can be collectively referred to as "dummy TSVs," and like thermal vertical structures or thermal TSVs, they are interposed between the chip layers of the 3D SoIC structure and have substantially equal size (e.g., a diameter from about 0.5 μm to about 2 μm). However, a difference between the dummy TSVs and the thermal vertical structures is that the position of the dummy TSVs, contrary to the position of the thermal vertical structures, does not change based on the presence of hot spots in the 3D SoIC structure. In other words, the dummy TSVs remain in their original positions, which are determined by process requirements as opposed to the location of the hot spots. On the other hand, the dummy TSVs and the thermal vertical structures can share the same liner material and metal core material. For example, both the dummy TSVs and the thermal vertical structures can have: a liner material that includes silicon oxide, organosilicate glass, etc.; and a core that includes a material with a thermal conductivity greater than about 200 W/(m·K) (e.g., copper, aluminum, etc.).

There are types of 3D SoIC structures that do not include dummy regions, but instead have molding regions. For these types of 3D SoIC structure with molding regions, vertical structures and TIM ring structures can be formed in the molding regions to assist with the heat dissipation process, according to some embodiments. By way of example and not limitation, the molding regions of a 3D SoIC structure can include a molding compound (e.g., an epoxy-based material) that encapsulates the chips or dies in the entire die layer and provides structural support to the 3D SoIC structure. This means that the molding region can extend over the area of each chip layer (e.g., entire area of each chip layer) and, thus, is not limited to the periphery or the edges of the die layer like the dummy region in other types 3D SoIC structures. Furthermore, the molding compound can be an electrical insulator (e.g., dielectric material) with poor thermal conductivity. Consequently, the 3D SoIC structures with molding regions can suffer from poor heat dissipation when hot spots are present in the 3D SoIC structure or the 3D SoIC structure includes multiple number of die layers (e.g., between about 2 and about 8 die layers).

Figure 8:
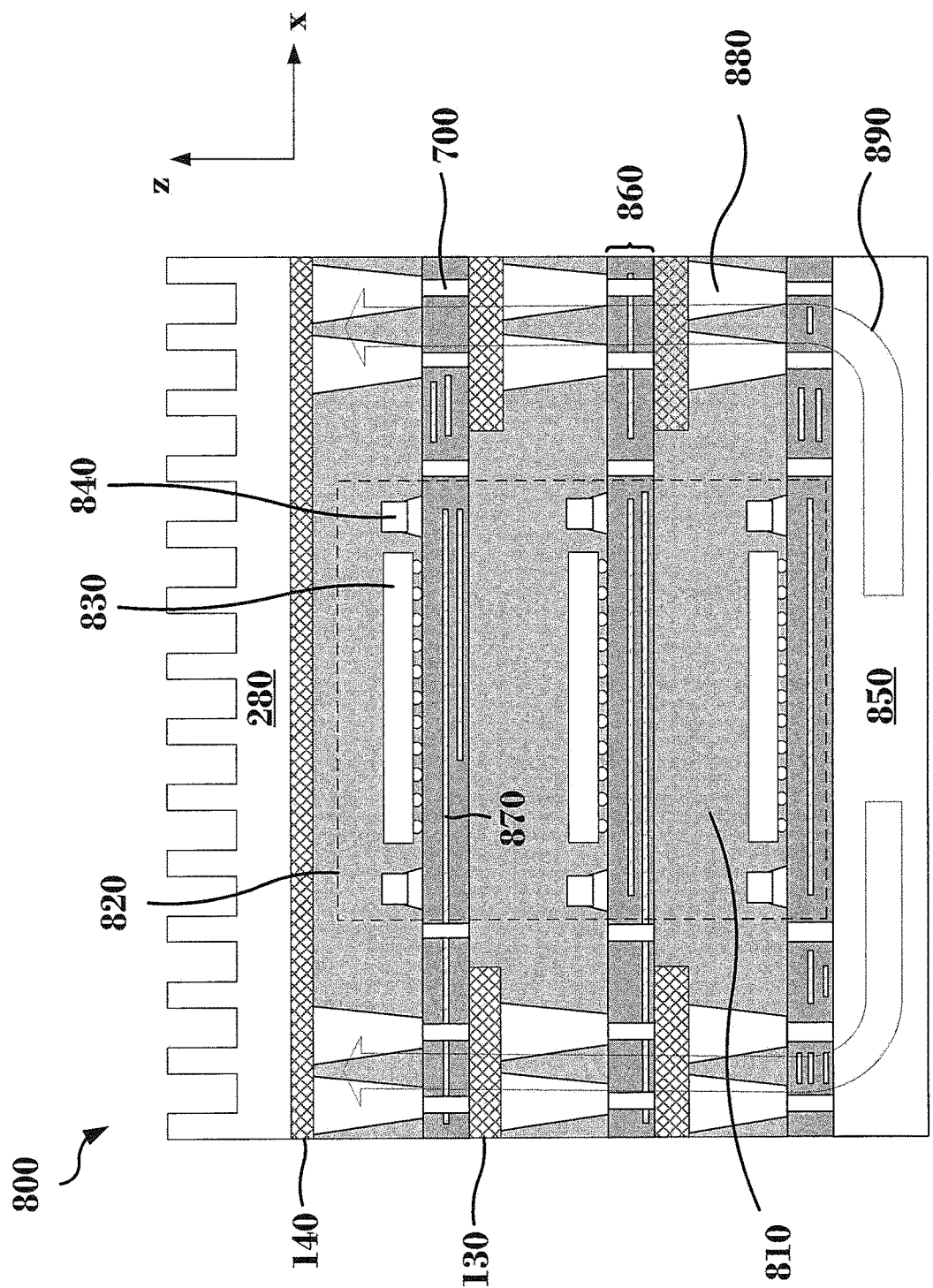
FIG. 8 is a cross sectional view of a three-dimensional system on integrated chip structure with thermally conductive vertical structures in a molding region, according to some embodiments.

By way of example and not limitation, FIG. 8 is a cross-sectional view of a 3D SoIC structure 800. 3D SoIC structure 800 with molding regions 810 (e.g., regions with a molding compound), according to some embodiments. By way of example and not limitation, 3D SoIC structure 800 further includes a memory stack 820 with multiple memory dies 830 embedded in molding regions 810. Multiple memory dies 830 are stacked on top of each other, as shown in FIG. 8. Memory dies 830 in memory stack 820 can include, for example, SRAM chips, DRAM chips, MRAM chips, other types of memory chips, logic chips, or combinations thereof. The number of memory dies that form stack 820 shown in FIG. 8 is not limiting and additional or fewer memory dies are within the spirit and the scope of this disclosure. Further, 3D SoIC structure 800 may include additional circuitry and electrical components that are not shown in FIG. 8 for simplicity. 3D SoIC structure 800 can also include a system on chip (SoC) 850, which can include chips or stack of chips (e.g., CPUs, heating elements, power distribution circuitry, etc.) that can generate excess heat that needs to be dissipated away from memory stack 820 and towards heat sink 280. An interface layer 860 is disposed below each memory die 830 and is electrically couple to it via hybrid bonding structures 840. Interface layer 860 may provide electrical connections 870 within a single memory die and between adjacent memory dies 830 through a network of vertical connections not shown in FIG. 8 for simplicity. In some embodiments, interface layer 860 is a redistribution layer (RDL) or a back-end of the line (BEOL) metallization network (e.g., an interconnect layer).

In some embodiments, excess heat generated by SoC 850 needs to be dissipated away memory stack 820 and towards heat sink 280, so that the temperature of memory stack 820 is below about 90° C. For this purpose, 3D SoIC structure 800 (similarly to 3D SoIC structure 200 shown in FIGS. 2A and 2B) can include TIM rings 130 over each molding region 810. 3D SoIC structure 800 also includes a top TIM layer 140 below heat sink 280. In some embodiments, TIM rings 130 are disposed at the periphery of molding region 810 to enhance the heat dissipation from SoC 850 around memory stack 820. According to some embodiments, dummy vertical structures 700 and vertical structures 880, which can be disposed respectively in interface layers 860 and molding regions 810, are coupled with TIM rings 130 to provide an upward heat dissipation path from SoC 850 towards heat sink 280. According to some embodiments, each of vertical structures 880 in molding regions 810 has a diameter that is about double the size of the diameter of dummy vertical structures 700 and can provide electrical connections between adjacent dies in memory stack 820. Further, vertical structures 880 can include a thermally conductive material with a thermal conductivity greater than about 200 W/(m·K). By way of example and not limitation, vertical structures 880 can include a metal, such as copper or aluminum.

In addition to the aforementioned heat conductive structures in molding regions 810 of the 3D SoIC structure, SoC 850 can include thermal vertical structures (not shown in FIG. 8) according to the layout combinations of FIG. 5 to dissipate the heat generated by the chips in SoC 850 towards the periphery of 3D SoIC structure 800 and along the heat dissipation path formed by dummy vertical structures 700, vertical structures 880, and TIM rings 130. According to some embodiments, arrows 890 illustrate the heat dissipation paths from SoC 850 towards heat sink 280. Therefore, a combination of thermal vertical structures in SoC 850, TIM rings 130, dummy vertical structures 700, and vertical structures 880 in molding region 810 can channel the heat generated by SoC 850 around memory stack 820 to limit the temperature of memory stack 820 below about 90° C.

Figure 9:
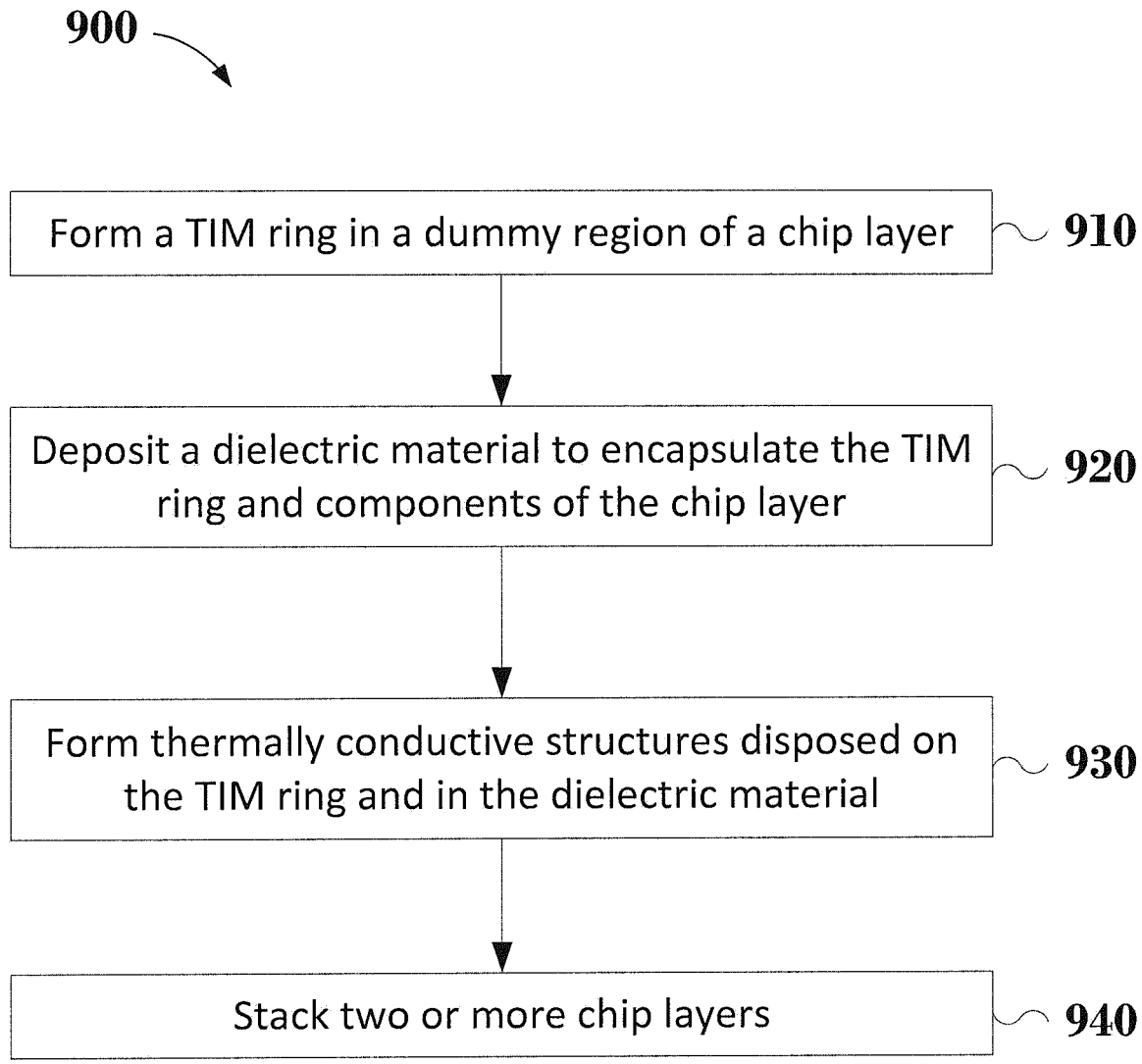
FIG. 9 is a flow chart of a method for the fabrication of a 3D three-dimensional system on integrated chip structure with thermal interface rings and thermally conductive structures, according to some embodiments.

According to some embodiments, FIG. 9 is an exemplary method 900 for the fabrication of a 3D SoIC structure, like the 3D SoIC structures shown in FIGS. 1, 2A, 2B, and 8. Fabrication method 900 is exemplary and not limiting. Therefore, additional or alternative operations in method 900 may be performed in place of the operations shown in FIG. 9. Further, the order of the operations of method 900 shown in FIG. 9 is not limiting.

Method 900 begins with operation 910 and the formation of a TIM ring in a dummy region of a chip layer. The chip layer can include one or more chips attached to a substrate as shown, for example, in FIG. 1 for any of chip layers 100A-100D. It is noted that in FIG. 1 the substrate on which chips 110 are attached is not shown for simplicity. In some embodiments, the substrate includes a polyimide (PI) or a polybenzoxazole (PBO) material and one or more redistribution layer. As discussed above, a dummy region of a chip layer can be located, for example, at the periphery of the chip layer. In some embodiments, the periphery of the chip layer is reserved for components that provide structural support to the structure formed when two or more chip layers are vertically stacked. At this stage of the fabrication process, the periphery of the chip layer is not occupied. According to some embodiments, a TIM ring can be formed at the periphery of the chip layer to form a ring that surrounds the chips of the chip layer. In some embodiments, the TIM ring can be formed before the chips are attached to the substrate. For example, the TIM ring can be deposited and patterned before the chips are attached. Alternatively, the TIM ring may be disposed (e.g., with a nozzle) on the substrate after the chips have been attached to the substrate.

Method 900 proceeds with operation 920 and the deposition of a dielectric material to encapsulate the TIM ring and the components of the chip layer (e.g., the chips). In some embodiments, the dielectric material can be an oxide-based dielectric, such as silicon oxide, deposited with plasma enhanced chemical vapor deposition or another suitable method. The dielectric material can be subsequently planarized with chemical mechanical polishing (CMP). In an alternative embodiment, the dielectric material is a molding compound, such as an epoxy-based material, that is dispensed (e.g., coated) and left to cool and harden. Once the molding compound hardens, it can be partially grinded and polished. As a result of the aforementioned process, the chips and the TIM ring become encapsulated in the dielectric material. In some embodiments, the dielectric layer extends across the entire surface of the chip layer. In additional embodiments, the dielectric material provides structural support when two or more chip layers are stacked together. By way of example and not limitation, the dielectric material of operation 920 can be similar to the material in dummy regions 220 in FIGS. 2A and 2B and the material in molding regions 810 in FIG. 8.

Referring to FIG. 9, method 900 continues with operation 930, where thermally conductive structures are formed in the dielectric material. In some embodiments, the thermally conductive structures can be formed by forming openings in the dielectric material with photolithography and etching operations, and subsequently depositing thermally conductive material in the openings to form the thermally conductive structures. The thermally conductive structures can be arranged to form heat dissipation paths at the periphery of the chip layer by making physical contact to the TIM ring, like (i) complementary thermally conductive structures 295A and segments of complementary structures 295B, as shown in FIG. 2B; and (ii) vertical structures 880 shown in FIG. 8. In some embodiments, if the dielectric material is a molding compound, the thermally conductive structures are formed prior to the molding compound application on the chip layer. For example, the thermally conductive structure can be formed in a sacrificial photoresist layer that is removed prior to the formation of the molding compound. Therefore, the thermally conductive structures are present when the molding compound is dispensed on the chip layer. In this case, operation 930 may be performed prior to operation 920 depending on the type of the dielectric material.

In referring to FIG. 9, method 900 continues with operation 940, where two or more chip layers are stacked together to form a 3D SoIC structure. In some embodiments, prior to stacking the chip layers together, bonding structures (such as bonding pad structures 250 shown in FIGS. 2A and 2B, or hybrid bonding structures 840 shown in FIG. 8) and interface layers (such as interface layer 860 shown in FIG. 8) may be formed to facilitate the mechanical and electrical coupling of the adjoining chip layers. In alternative embodiments, interface layers (such as interface layer 860 shown in FIG. 8) or boding structures may be present on the substrate before the chips are attached to the substrate to form the chip layer. In some embodiments, the chips layers are subsequently aligned via an alignment process that uses alignment marks as a guide so their respective mechanical and electrical connection points are properly aligned when the chip layers are stacked. Subsequently, the aligned chip layers are bonded together to form a stack. In some embodiments the stack of chip layers is diced at the end of the bonding process.

The present disclosure is directed to heat dissipating structures that can be formed either in functional or non-functional areas of 3D SoIC structures. In some embodiments, the heat dissipating structures maintain an average operating temperature of memory dies or chips below about 90° C. By way of example and not limitation, the heat dissipating structures can include thermal interface material (TIM) rings and vertical conductive structures disposed in the dummy regions or the molding regions of the 3D SoIC structure, vertical conductive structures disposed within the chip area and around heat output areas (hot spots), or combinations thereof. In some embodiments, existing vertical structures in a 3D SoIC structure can be structurally modified to function as additional heat dissipation paths. The embodiments described herein can be applied to a range of 3D SoIC structures that include, but are not limited to, 3D SoIC structures with dummy areas and molding regions.

In some embodiments, a structure includes a stack of one or more chip layers, where each chip layer includes: a center portion with one or more chips and an edge portion surrounding the center portion having a thermal interface material ring. The structure further includes a thermal interface material layer disposed over a top chip layer of the stack and a heat sink over the thermal interface material layer.

In some embodiments, a method includes attaching one or more chips in a first region of a substrate, where the substrate with the one or more chips forms a first chip layer. The method further includes depositing a thermal interface material on a second region of substrate, where the thermal interface material forms a closed loop around the one or more chips, forming one or more thermally conductive structures on the thermal interface material, and depositing a dielectric layer on the substrate so that the one or more chips and thermally conductive structures are embedded in the dielectric layer.

In some embodiments, a structure includes a bottom chip layer and a stack of dies over the bottom chip layer. The stack includes interconnect layers configured to provide interconnects for the dies, where the interconnect layers include first thermally conductive vertical structures. The stack further includes a molding region surrounding each die in the stack, where the molding region includes second thermally conductive vertical structures and a thermal interface material.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a stack of two or more chip layers, wherein a chip layer of the stack of two or more chip layers comprises:
      a center portion comprising one or more chips; and
      an edge portion surrounding the center portion and comprising:
         a thermal interface material ring comprising a first material having a first thermal conductivity, and
         a thermally conductive structure comprising a second material having a second thermal conductivity higher than the first thermal conductivity, wherein the thermally conductive structure extends vertically through the chip layer, and is in physical contact with the thermal interface material ring;
   a thermal interface material layer disposed over a top chip layer of the stack; and
   a heat sink over the thermal interface material layer.

2. The structure of claim 1, wherein the thermally conductive structure is a first thermally conductive structure, and wherein the edge portion of the chip layer further comprises:
   a dummy region located at the edge portion of the chip layer, wherein the dummy region comprises a dielectric material disposed on and in physical contact with the thermal interface material ring, wherein the dielectric material has a third thermal conductivity lower than the first thermal conductivity; and
   a second thermally conductive structure laterally extending through the dielectric material of the dummy region, wherein the first thermally conductive structure, the second thermally conductive structure, and the thermal interface material ring are configured to channel heat generated in the stack through the edge portion of the chip layer towards the heat sink.

3. The structure of claim 2, the first and second thermally conductive structures comprise a material with a thermal conductivity greater than about 200 W/m·K.

4. The structure of claim 1, wherein the thermal interface material ring forms a continuous layer around the one or more chips of the chip layer.

5. The structure of claim 4, wherein the continuous layer has a thickness between about 0.3 mm and about 0.8 mm.

6. The structure of claim 1, wherein the one or more chips comprise memory chips.

7. A structure, comprising:
   a plurality of chip layers, wherein a chip layer of the plurality of chip layers comprises:
      one or more chips; and
      an edge portion surrounding the one or more chips and comprising:

a thermal interface material (TIM) ring comprising a first material having a first thermal conductivity and surrounding the one or more chips, and a thermally conductive structure comprising a second material having a second thermal conductivity higher than the first thermal conductivity, wherein the thermally conductive structure extends vertically through the chip layer, and is in physical contact with the thermal interface material ring; and a TIM layer on the plurality of chip layers.

8. The structure of claim 7, wherein the one or more chips comprise memory chips.

9. The structure of claim 7, wherein the TIM ring forms a continuous layer around the one or more chips.

10. The structure of claim 9, wherein the continuous layer has a thickness between about 0.3 mm and about 0.8 mm.

11. The structure of claim 7, wherein the TIM ring is located in a non-functional area in the chip layer.

12. The structure of claim 7, wherein the TIM layer comprises silver, aluminum nitride, silicon carbide, or combinations thereof.

13. The structure of claim 7, wherein the TIM layer comprises a thermal grease with a thermal conductivity between about 1.5 W/(m·K) and about 15 W/(m·K).

14. The structure of claim 7, wherein the TIM layer has a thickness between about 0.1 mm and about 0.5 mm.

15. The structure of claim 7, wherein the thermally conductive structure, the TIM ring and the TIM layer are arranged to form a heat dissipation path from a bottom most chip layer of the plurality of chip layers to the TIM layer.

16. A structure, comprising:
a stack of two or more chip layers, wherein a chip layer of the stack of two or more chip layers comprises:
one or more chips; and
a non-functional region comprising:
a thermal interface material (TIM) ring comprising a first material having a first thermal conductivity; and
a thermally conductive structure comprising a second material having a second thermal conductivity higher than the first thermal conductivity, wherein the thermally conductive structure extends vertically through the chip layer, and is in physical contact with the thermal interface material ring;
a TIM layer on a top most chip layer in the stack of two or more chip layers; and
a heat sink on the TIM layer.

17. The structure of claim 16, wherein the non-functional region further comprises a dielectric material.

18. The structure of claim 16, wherein the TIM ring forms a continuous layer around the one or more chips.

19. The structure of claim 16, wherein the TIM layer comprises silver, aluminum nitride, silicon carbide, or combinations thereof.

20. The structure of claim 16, wherein the TIM layer comprises a thermal grease with a thermal conductivity between about 1.5 W/(m·K) and about 15 W/(m·K).

* * * * *